United States Patent [19]

Zwack

[11] Patent Number: 5,703,480
[45] Date of Patent: Dec. 30, 1997

[54] METHOD AND ARRANGEMENT FOR DETERMINING THE PHASE DIFFERENCE BETWEEN CLOCK SIGNALS IN A COMMUNICATION EQUIPMENT

[75] Inventor: Eduard Zwack, Puchheim, Germany

[73] Assignee: Siemens Aktiengesellschaft, Munich, Germany

[21] Appl. No.: 588,682

[22] Filed: Jan. 19, 1996

[30] Foreign Application Priority Data

Jan. 31, 1995 [DE] Germany .................. 195 03 035.4

[51] Int. Cl.$^6$ .................. H03K 5/26; G01R 29/18
[52] U.S. Cl. .................. 324/76.82; 324/76.54; 327/253; 327/161
[58] Field of Search .................. 327/236, 244, 327/252, 253, 161, 160, 149; 324/76.82, 76.54, 76.55

[56] References Cited

U.S. PATENT DOCUMENTS

| | | | |
|---|---|---|---|
| 4,963,817 | 10/1990 | Kohiyama | 324/76.82 |
| 5,412,311 | 5/1995 | Rothermel | 324/76.82 |
| 5,416,444 | 5/1995 | Yamauchi | 324/76.82 |
| 5,568,071 | 10/1996 | Hoshino | 324/76.82 |

FOREIGN PATENT DOCUMENTS 0 274 606  7/1988  European Pat. Off. .
0 389 662  10/1990  European Pat. Off. .

*Primary Examiner*—Ernest F. Karlsen
*Assistant Examiner*—Jose M. Solis
*Attorney, Agent, or Firm*—Hill, Steadman & Simpson

[57] ABSTRACT

The method determines the phase difference in phase locked loops using clock signals (ts) generated in clock generators of communication equipment are synchronized to incoming reference clock signals (rts). The phase difference is determined by a rough phase difference and by a fine phase difference. The fine phase difference is represented by the plurality of delay elements (VE) of a delay line (VZL) that an incoming reference clock signal (rts) traverses up to the following clock signal (ts). A precise determination of the absolute delay time of a delay element (VE) is possible using the method, whereby components' tolerances cause considerable delay time differences of a delay element (VE) or, respectively, of the delay line (VZL). A considerable enhancement of the precision in determining the phase difference of cloak signals (ts) and reference clock signals (rts) and, thus, of the phase locked loops is achieved by the more precise determination of the absolute delay time of a delay element (VE).

10 Claims, 1 Drawing Sheet

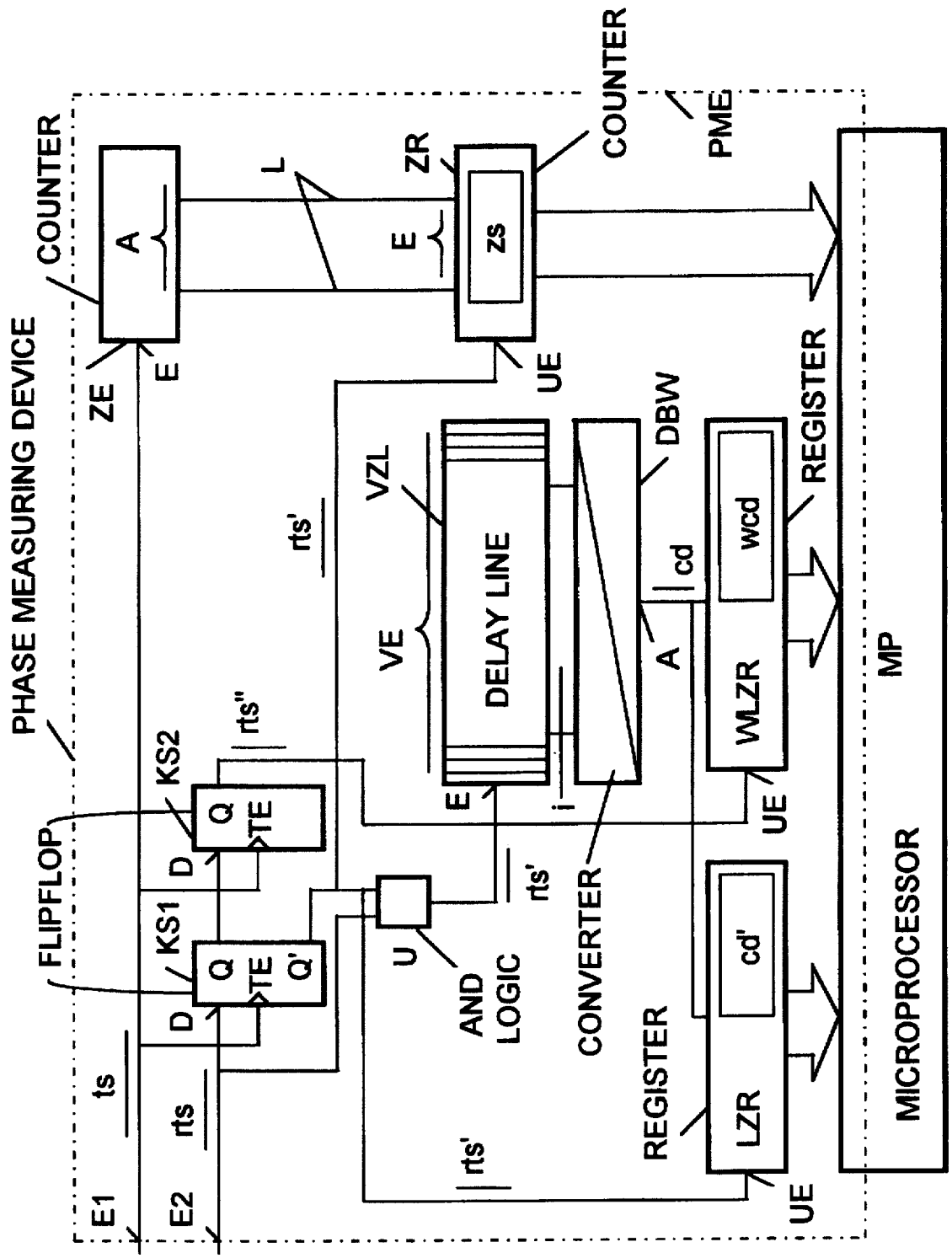

5,703,480

METHOD AND ARRANGEMENT FOR DETERMINING THE PHASE DIFFERENCE BETWEEN CLOCK SIGNALS IN A COMMUNICATION EQUIPMENT

BACKGROUND OF THE INVENTION

A high-precision, failure-protected clock generator means is centrally installed in synchronously operated communication equipment. The clock signals generated in this clock generator means are distributed to all components of a communication network via transmission-oriented equipment together with the digital information to be communicated, for example voice information. Clock signals whose phases coincide with the phases of the incoming, high-precision reference clock signals (that is, the distributed clock signals) are respectively generated in the components using clock generator means equipped with phase locked loops.

European Patent 0 389 662 B1 discloses a clock generator means with a phase locked loop. The clock signals generated in a voltage-controlled clock oscillator are synchronized in terms of phase or, respectively, frequency with the incoming reference clock signals in the clock generator means using a phase locked loop formed by a phase measuring means and a control means. The phase difference between the clock signals and the reference clock signals is determined in the phase measuring means using a counter means, a delay line formed by series-connected delay elements as well as a count and running time register. The clock signals are thereby counted in a counter means and the current counter reading is respectively transferred into a count register at points in time (for example, at the positive signal edge) defined by the reference clock signals and synchronized to the clock signals.

The reference clock signals pass through the series-connected delay elements of the delay line, whereby a run time information representing the plurality of delay elements traversed by the reference clock signal is respectively transferred into a run time register at points in time defined by the following clock signal. The phase difference is calculated in the control means using the counter reading and of the run time information, whereby the phase difference in clock signal periods (that is, the rough phase difference) is determined from the difference between the current and the preceding counter reading. The phase difference within a clock signal period (that is, the fine phase difference) is determined from the run time information. Together, the rough and fine phase difference form the phase difference between the clock signals and the reference clock signals. The calculation of the phase difference ensues using a program implemented in the control means.

The delay line is formed by a plurality of delay elements. For example, European Published Application 0 274 606 discloses a delay chain formed in this way. The delay elements or, respectively, transport delay units are realized by n-channel and p-channel field effect transistors and inverters formed therefrom. Due to the components' tolerances, especially the semiconductor components' tolerances, the delay elements have run times differing by up to a factor of 4, for example between 0.5 ns and 2 ns. Since the run time information is represented by the plurality of traversed delay elements, considerable differences between the determined, that is, the calculated and the actual run time of the reference clock signal in the delay line derive in the calculation of the phase difference, wherein the plurality of traversed delay elements is multiplied by the delay time of a delay element. This is essentially caused in that an average run time is provided for the determination or, respectively, calculation, this lying approximately between the actual minimum and maximum delay times caused by the components' tolerances.

SUMMARY OF THE INVENTION

It is an object of the present invention to provide an improved method for determining phase difference, especially in view of the precision of the fine phase difference between clock signals and reference clock signals.

In general terms the present invention is a method for determining the phase difference between a clock signal and a reference clock signal. The clock signals are counted in a counter means. The current counter reading is transferred into a count register at points in time determined by the reference clock signals and synchronized to the clock signals. The reference clock signals traverse series-connected delay elements of a delay line. Run time information representing the plurality of delay elements traversed by the reference clock signal is respectively transferred into a run time register at points in time defined by the following clock signal. Further run time information representing the plurality of delay elements traversed during a cycle of the clock signal is transferred into a further run time register. The absolute delay time of a delay element is calculated using the further run time information and the duration of a cycle of the clock signal. The absolute run time information is calculated using the absolute delay time of a delay element. The phase difference is determined using the stored counter reading and of the absolute run time information.

An important aspect of the present invention is that, using a further run time register, that is, an intermediate memory, the plurality of delay elements traversed by a reference clock signal, that is, by the signal edge of a reference clock signal, during a period or cycle is identified and stored therein. Since the duration of a period or cycle of a clock signal (for example, 100 ns) is precisely defined, the absolute delay time of a delay element can be precisely determined by a division of the duration of a cycle of a clock signal by the plurality of traversed delay elements that is found. The overall run time of a reference clock signal or, respectively, the signal edge thereof from the beginning of a reference clock signal up to the following beginning of a clock signal (represented by the signal edge thereof) is determined by a multiplication of the absolute delay time of a delay element by the identified plurality of traversed delay elements. The phase difference can be calculated therefrom with reference to a cycle of a clock signal. The absolute delay time of a delay element can be advantageously substantially more precisely determined with the inventive method and, thus, the phase difference (particularly the fine phase difference) can be significantly more precisely determined. In a phase locked loop, this means a significantly more precise synchronization of clock signals to reference clock signals since a phase difference measuring means realizing the inventive method has a substantially greater resolution, that is, substantially improved precision.

Advantageous developments of the present invention are as follows.

The absolute delay time of a delay element is determined by a division of he predetermined duration of the cycle of a clock signal by the number of delay elements represented by the further run time information.

The rough phase difference between a clock signal and a reference clock signal represented by cycles of the clock signal is determined by subtraction of the current counter reading from the preceding counter reading. The fine phase difference within a cycle of the clock signal is determined by multiplication of the absolute delay time of a delay element by the number of delay elements represented by the run time information. The phase difference between the clock signals and the reference clock signals is respectively determined by a summing of the rough and fine phase difference.

The points in time defined by the clock or reference clock signals are represented by the negative or positive edges of the clock signals or, respectively, reference clock signals.

The present invention is also an arrangement for determining the phase difference between a clock signal and a reference clock signal. A counter means counts the clock signals, whereby each counting result is represented by a counter reading. A count register respectively accepts the current counter reading at points in time determined by the reference clock signals and synchronized to the clock signals. A delay line is formed by series-connected delay elements traversed by the reference clock signals. A run time register respectively accepts run time information representing the number of delay elements traversed by the reference clock signal at points in time defined by a following clock signal. A further run time register is provided that accepts a further run time information representing the plurality of delay elements traversed during a cycle of the clock signal. A microprocessor is fashioned such that: the absolute delay time of a delay element is calculated using the further run time information and the duration of a cycle of the clock signal; the absolute run time information is calculated using the absolute delay time of a delay element; and the phase difference is determined using the stored counter reading and of the absolute run time information.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, in which:

The single FIGURE is a block diagram of the present invention.

DESCRIPTION OF THE PREFERRED EMBODIMENTS

The block circuit diagram in the single FIGURE shows a phase measuring means PME (bounded by dot-dash lines) that is formed by a counter means ZE, a count register ZR, a delay line VZL, a decimal-binary converter DBW, a run time register LZR as well as a further run time register WLZR, an AND logic element U, a first as well as a second flipflop KS1, KS2 and, partially, by a microprocessor MP. A first input E1 of the phase measuring means PME is connected to an input E of the counter means ZE as well as to a respective clock input TE of the two flipflops KS1, KS2. Via this first input E1, the clock signals ts having, for example, a duration of a cycle of 100 ns proceed to the clock inputs TE of the two flipflops KS1, KS2 and to the input E of the counter means ZE. The outputs A of the counter means ZE are connected to inputs E of the count register ZR. The counter readings zs of the clock signals ts counted in the counter means ZE are present at the outputs A of the counter means ZE. For example, the counter reading zs is represented at 20 outputs, that is, 20 bits of the counter means ZE. This means that the counter means ZE is connected to the count register ZR via 20 lines L.

A second input E2 of the phase measuring means PME is conducted to an input D of the first flipflop KS1 (for example, to the D-input of the flipflop KS1) and to an input of the AND logic element U. The output Q of the first flipflop KS1 is connected to an input D of the second flipflop KS2, and the inverting output Q' of the first flipflop is connected to a further input of the AND logic element U. The output of the AND logic element U is connected onto an input of the delay line VZL. The delay line VZL comprises serially connected delay elements VE that form a delay chain. The individual delay elements VE or, respectively, transport delay units are realized, for example, by n-channel and p-channel field effect transistors and inverters formed therefrom. A delay chain formed in this way is disclosed by European Published Application 0 274 606. Let it be assumed for the exemplary embodiment that the delay line VZL is formed by 200 delay elements, whereby each delay element can comprise an absolute delay time from 0.5 to 2 ns due to components' tolerances. Given a minimum delay time of 0.5 ns per delay element, the delay time of a signal edge characterized in that of a signal due to the delay line amounts to 100 ns. Since the duration of a cycle of clock signal ts likewise comprises 100 ns, the delay time of a signal edge or, respectively, of a signal within the cycle of a clock signal ts can be calculated. The 200 outputs (not shown in detail) respectively provided between the delay elements VE of the delay line VZL are conducted to a decimal-binary converter DBW in which coded binary information cd are formed dependent on binary information i present at the outputs of the delay elements VE and are communicated to the further run time register WZR via outputs A of the decimal-binary converter DBW. The information cd stored in the further run time register WLZR can be read by the microprocessor MP via connections indicated with an arrow for the purpose of further processing. Further, this further run time register WLZR comprises a transfer input UE that is connected to the output Q of the second flipflop KS2.

The inverting output Q' of the first flipflop KS1 is additionally connected to a transfer input UE of the run time register LZR and to a transfer input UE of the count register ZR. The outputs A of the decimal-binary converter DBW are conducted parallel to the run time register LZR in addition to the further run time register WZL. The information stored in the run time register LZR can be read by the microprocessor MP via connections indicated by an arrow for the purpose of further processing.

The clock signals ts incoming at the first input E1 are continuously counted in the counter means ZE. A reference clock signal rts (represented, for example, by a positive signal edge) arriving a the second input E2 proceeds to the input D of the first flipflop KS1 and to the AND logic element U. The edge change of the reference clock signal rts proceeds via the output Q to the input D of the second flipflop KS2 with the edge (for example, the positive edge) of the following clock signal TS. The inverting output Q' of the first flipflop KS1 has high potential until the arrival of, for example, the positive edge of the clock signal ts. This means that both inputs of the AND logic element U have high potential with the arriving, positive edge of the reference clock signal rts, and the output of the AND logic element U is driven to high potential. The positive edge of the reference clock signal rts'" is thereby controlled to the input E of the delay line VZL and successively passes through the delay line VZL. The outputs of the delay line VZL thereby constantly change in potential or, respectively, with respect to the information i, whereby this information i is constantly converted into coded information cd by the decimal-binary converter. This coded information cd respectively represent the plurality of traversed delay elements VE in, for example, binary or hexadecimal form. As already described, the inverting output Q' of the potent flipflop KS1 changes from high potential to low potential with the arrival of, for example, the positive signal edge of the clock signal ts. What this change in edge or, respectively, potential effects is that the coded information cd present at the output A of the decimal-binary converter DBW is transferred into the run time register DBW. The currently transferred coded information cd represents the plurality of traversed delay elements VE from the signal change of the incoming reference clock signal rts'" up to the signal change of the following clock signal ts.

The edge change of the above-explained reference clock signal rts' is driven to the output Q of the second flipflop KS2 with the arrival of the edge change of the clock signal ts following the above-explained clock signal ts. As a result of this edge change of the reference clock signal rts', a transfer of the coded information cd present at the outputs A of the decimal-binary converter into the further run time register WLZR is effected. The coded information cd now stored in the further run time register WLZR represents the plurality of delay elements VE traversed by the edge change of the reference clock signal rts during a cycle of the clock signal ts. When, for example, 125 delay elements VE are traversed given the cycle duration of 100 ns of the clock signal ts, then a delay element VE has an absolute delay time of 100 ns divided by 125 delay elements, that is, 0.8 ns. This calculation is implemented in the microprocessor MP by reading out the coded information cd from the further run time register WLZR, whereby the duration of a cycle of the clock signal ts (for example, 100 ns) is stored in the microprocessor MP. Based on the calculated, absolute delay time of a delay element VE, the phase difference within a cycle of the clock signal ts is calculated in the microprocessor MP with the assistance of the coded information cd stored in the run time register LZR. The plurality of traversed delay elements VE indicated by the coded information cd is multiplied by the absolute delay time of a delay element VE and an overall delay time is determined with whose assistance the phase difference within a clock signal ts is calculated with reference to the duration of the cycle of a clock signal ts. The phase difference identified within a clock signal ts is referred to as fine phase difference.

The edge change of the reference clock signal rts' appearing at the inverting output Q' of the first flipflop KS1 effects, further, the transfer of the current counter reading zs of the counter means ZE into the count register ZR. This current counter reading zs is read by the microprocessor MP, and the deviating cycles of clock signals ts in view of the phase deviation are determined by comparison to the preceding counter reading zs of the preceding reference clock signal rts. The phase difference is thereby consequently determined from the plurality of clock cycles of the clock signal ts. This phase difference is referred to as rough phase difference. The overall phase deviation of the clock signals ts and reference clock signals rts is calculated in the microprocessor MP by summing up the rough and fine phase difference. Due to the determination of the absolute delay time of the delay elements VE, the phase difference calculated in this way has an extremely high precision or, respectively, resolution. The inventive method is accordingly employable in phase measuring means PME of high-precision phase locked loops. Such high-precision phase locked loops are provided in clock means of communication equipment, particularly digital, processor-controlled switching systems. Over and above this, the inventive method can be used in all communication equipment wherein high-precision phase locked loops are synchronized with the assistance of incoming high-precision reference clock signals.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A method for determining a phase difference between a first clock signal and a reference clock signal, comprising the steps of:

counting first clock signals in a counter;

transferring a current counter reading of the counter into a count register at points in time determined by reference clock signals and synchronized to the first clock signals;

forwarding a relevant edge of the reference clock signals through a number of series-connected delay elements of a delay line;

transferring first run time information, that represents the number of delay elements traversed by the reference clock signal, into a first run time register at points in time defined by a following first clock signal;

transferring second run time information, that represents the number of delay elements traversed during a cycle of the first clock signal, into a second run time register;

calculating an absolute delay time of a delay element using the second run time information and the duration of a cycle of the first clock signal;

calculating absolute run time information using the absolute delay time of a delay element; and determining a phase difference between the first clock signals and the reference clock signals using the counter reading in the count register and the absolute run time information.

2. The method according to claim 1, wherein the absolute delay time of a delay element is determined by a division of a predetermined duration of the cycle of a first clock signal by the number of delay elements represented by the second run time information.

3. The method according to claim 1, wherein a rough phase difference between a first clock signal and a reference clock signal represented by cycles of the first clock signal is determined by subtraction of the current counter reading from a preceding counter reading, wherein a fine phase difference within a cycle of the first clock signal is determined by multiplication of the absolute delay time of a delay element by the number of delay elements represented by the run time information; and wherein phase difference between the first clock signals and the reference clock signals is respectively determined by a summing of the rough phase difference and fine phase difference.

4. The method according to claim 1, wherein the points in time defined by the first clock signals are represented by negative or positive edges of the first clock signals.

5. The method according to claim 1, wherein the points in time defined by the reference clock signals are represented by negative and positive edges of the reference clock signals.

6. An arrangement for determining the phase difference between a first clock signal and a reference clock signal, comprising:

a counter that counts first clock signals, whereby each result of counting is represented by a counter reading;

a count register that respectively accepts a current counter reading at points in time determined by reference clock signals and synchronized to the first clock signals;

a delay line formed by series-connected delay elements, the delay line being traversed by the reference clock signals;

a first run time register that respectively accepts first run time information representing the number of delay elements traversed by the reference clock signal at points in time defined by a following first clock signal;

a second run time register that accepts a second run time information representing the number of delay elements traversed during a cycle of the first clock signal;

a microprocessor structured such that the absolute delay time of a delay element is calculated using the second run time information and the duration of a cycle of the first clock signal, such that the absolute run time information is calculated using the absolute delay time of a delay element, and such that the phase difference is determined using the stored counter reading and of the absolute run time information.

7. A method for determining a phase difference between a first clock signal and a reference clock signal, comprising the steps of:

counting first clock signals in a counter;

transferring a current counter reading of the counter into a count register at points in time determined by reference clock signals and synchronized to the first clock signals;

forwarding a relevant edge of the reference clock signals through a number of series-connected delay elements of a delay line;

transferring first run time information, that represents the number of delay elements traversed by the reference clock signal, into a first run time register at points in time defined by a following first clock signal;

transferring second run time information, that represents the number of delay elements traversed during a cycle of the first clock signal, into a second run time register;

calculating an absolute delay time of a delay element using the second run time information and the duration of a cycle of the first clock signal;

calculating absolute run time information using the absolute delay time of a delay element;

determining a rough phase difference between the first clock signal and the reference clock signal represented by cycles of the first clock signal by subtraction of the current counter reading from a preceding counter reading;

determining a fine phase difference within a cycle of the first clock signal by multiplication of the absolute delay time of a delay element by the number of delay elements represented by the run time information; and determining a phase difference between the first clock signals and the reference clock signals by summing the rough phase difference and fine phase difference.

8. The method according to claim 7, wherein the absolute delay time of a delay element is determined by a division of a predetermined duration of the cycle of a first clock signal by the number of delay elements represented by the second run time information.

9. The method according to claim 7, wherein the points in time defined by the first clock signals are represented by negative or positive edges of the first clock signals.

10. The method according to claim 7, wherein the points in time defined by the reference clock signals are represented by negative and positive edges of the clock signals.

* * * * *